(12) United States Patent
Huang

(10) Patent No.: US 6,763,052 B2
(45) Date of Patent: Jul. 13, 2004

(54) LASER HAVING EQUILATERAL TRIANGULAR OPTICAL RESONATORS OF ORIENTING OUTPUT

(75) Inventor: Yongzhen Huang, Beijing (CN)

(73) Assignee: Institute of Semiconductors, Chinese Academy of Sciences (CN)

( * ) Notice: Subject to any disclaimer, the term of this patent is extended or adjusted under 35 U.S.C. 154(b) by 106 days.

(21) Appl. No.: 10/257,655

(22) PCT Filed: Jan. 10, 2001

(86) PCT No.: PCT/CN01/00013
§ 371 (c)(1),
(2), (4) Date: Oct. 16, 2002

(87) PCT Pub. No.: WO01/80385
PCT Pub. Date: Oct. 25, 2001

(65) Prior Publication Data
US 2003/0123515 A1 Jul. 3, 2003

(30) Foreign Application Priority Data

Apr. 17, 2000 (CN) ...................................... 001058754 A
Sep. 6, 2000 (CN) ...................................... 001237756 A

(51) Int. Cl.[7] ........................... H01S 3/08; H01S 3/081; H01S 3/083
(52) U.S. Cl. ............................. 372/92; 372/93; 372/94; 372/108; 372/50
(58) Field of Search ...................... 372/50, 108, 92–94; 385/31, 39, 40

(56) References Cited

U.S. PATENT DOCUMENTS 5,282,080 A    1/1994  Scifres et al. ............... 359/344
5,373,173 A   12/1994  Ohata et al. .................. 257/88
5,499,261 A    3/1996  Welch et al. .................. 372/50
5,793,785 A    8/1998  Nakanishi et al. ............ 372/36

FOREIGN PATENT DOCUMENTS

EP           706243        4/1996

OTHER PUBLICATIONS

Huang et al., "Analysis of Equilateral Triangle Semiconductor Microlasers with Rough Sidewalls", Jul. 19, 2001, The 4th Pacific Rim Conference on vol.: 2,pp.:II–612–II–613 vol. 2.*

(List continued on next page.)

*Primary Examiner*—Akm Enayet Ullah
*Assistant Examiner*—Kevin S. Wood
(74) *Attorney, Agent, or Firm*—Madson & Metcalf

(57) ABSTRACT

A semiconductor laser with an equilateral triangle micro optical resonator has an output waveguide connected to the resonator for realizing directional emission, and the laser wafer structure is the slab waveguide constituted by lower cladding layer, active region and the upper cladding layer. The outer region of the equilateral triangle is etched to the lower cladding layer or substrate, while the unetched equilateral triangle region is used as the resonator, and the triangular sides serve as the reflecting mirrors. On one of the vertices or the sides of the triangle resonator connected or coupled an output waveguide can form an edge emission semiconductor laser and array having directive light emission. If the output waveguide is intersected with an incline, enabling the output light to deflect 90° then surface emission output can be acquired, thereby a surface emission semiconductor laser and array is produced, and a multi-wavelength semiconductor laser or array can be made by the equilateral triangle micro optical resonators of various dimensions.

7 Claims, 3 Drawing Sheets

OTHER PUBLICATIONS

Huang et al., "A Semiconductor Laser Suitably Fabricated by Planar Technology", Oct. 25, 2001, Optoelectronics, IEE Proceedings–, vol.: 148, Issue: 56, pp.: 1234–1238 vol. 2.*

Guo, Wei–Hua, et al. "Resonant Frequencies and Quality Factors for Optical Equilateral Triangle Resonators Calculated by FDTD Technique and the Pade Approximation," IEEE Photonics Technology Letters, vol. 12, No. 7, Jul. 2000, pp. 813–815.

Huang, Yong–Zhen, et al. "Influence of Output Waveguide on Mode Quality Factor in Semiconductor Microlasters with an Equilateral Triangle Resonator," Applied Physics Letters, vol. 77, No. 22, Nov. 27, 2000, pp. 3511–3513.

Huang, Yong–Zhen, et al. "Analysis and Numerical Simulation of Eigenmode Characteristics for Semiconductor Lasers with an Equilateral Triangle Micro–Resonator," IEEE Journal of Quantum Electronics, vol. 37, No. 1, Jan. 2001, pp. 100–107.

Huang, Yong–Zhen, et al., "Analysis of Semiconductor Microlaster with an Equilateral Triangle Resonator by Rate Equations," IEEE Journal of Quantum Electronics, vol., 27, No. 10, Oct. 2001, pp. 1259–1264.

Huang, Yong–Zhen, et al., "Size Limit and Spontaneous Emission Factor For Equilateral Triangle Semiconductor Microlaster," IEE Oric,–Optoelectron., vol. 148, No. 5/6, Oct./Dec. 2001, pp. 229–232.

* cited by examiner

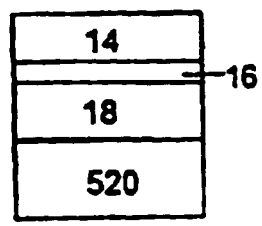
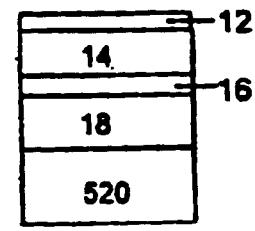
Fig. 4a  Fig. 4b
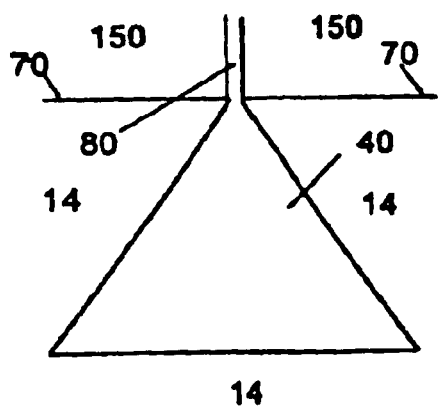
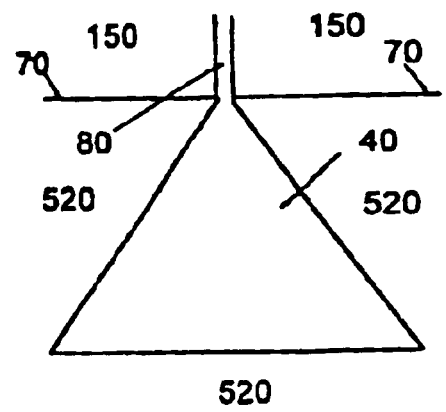
Fig. 4c  Fig. 4d
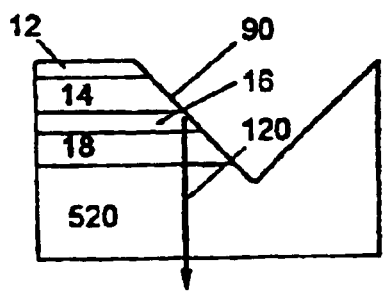
Fig. 4e

LASER HAVING EQUILATERAL TRIANGULAR OPTICAL RESONATORS OF ORIENTING OUTPUT

FIELD OF THE INVENTION

The present invention relates to a semiconductor laser (or semiconductor device), and more specifically to a semiconductor laser and array having equilateral triangle optical resonators with output wave guide.

BACKGROUND ART

Optical resonators are essential components of lasers, and light feedback and optical coherent intensifying effect take place in the resonator. Resonators of various structures may be applied for providing the feedback, e.g., Fabry-Perot resonator formed by parallel plane mirrors, distributive feedback Bragg resonator causing light feedback by periodical variations of refractive index or gain, and the micro-disk structure having total reflection Whispering gallery mode etc. Recently, we discover that single mode lasing can be easily realized in an equilateral triangle micro-resonator, and the equilateral triangle resonator may be directly connected to a waveguide to acquire light output. The lasers with an equilateral triangle resonator shall be suited for a light source of integrated optics and a micro semiconductor laser having orienting output. In view of the above, on April and September, 2000, we applied the China patents "photoelectric device having equilateral triangle micro optical resonators" (application Ser. No.: 00105875.4) and "surface emission laser with equilateral triangle resonators" (application Ser. No.: 00123775.6). And the papers "mode frequencies and quality factors calculated for equilateral triangular optical resonators by FDTD technique and Pade approximation," IEEE Photonics Technology Letters, vol. 12, pp 813–815, July 2000, "influence of output waveguide on mode quality factor in semiconductor microlasers with an equilateral triangle resonator," Applied Physics Letters, vol. 77, pp. 3511–3513, November 2000, and "analysis and numerical simulation of eigenmode characteristics for semiconductor lasers with an equilateral triangle micro-resonator," IEEE J. Quantum Electronics, vol. 37, pp. 100–107, January 2000, have been published. In the triangle resonator, optical field intensity of fundamental mode is rather weak in the three corners of triangle resonator, and high quality factor can still be guaranteed for the resonant mode of triangle resonator when an output waveguide is connected to the corner of resonator to acquire orienting light output. For a two-dimensional equilateral triangle resonator with side length 5 $\mu$m and refractive index 3.2, our numerical simulation implies that quality factor of the fundamental mode at the wavelength of about 1.5 $\mu$m can exceed 15,000, while when an output waveguide with width of 0.4 $\mu$m is connected to a vertex of the resonator, the quality factor of the fundamental mode remains to surpass 1500, which is more than the quality factor of a 300-$\mu$m-length Fabry-Perot resonator with cleaved mirrors. In the semiconductors, such as InP etc., the incline making an angle of 45° with the wafer surface can be obtained by wet chemical etching, that is "chemical etching of InGaAsP/InP DH wafer," J. Electrochem. Soc: Solid-State Science and Technology, vol. 129, no. 5, pp. 1053–1062, May, 1982). Thus, if the output waveguide of equilateral triangle optical resonator intersects with the aligned incline making an angle of 45° with the wafer surface, surface emission semiconductor laser with the equilateral triangle optical resonator can be realized. An incline making an angle of 45° with the wafer surface can also be acquired by dry etching technique by placing the semiconductor wafer at an inclined angle.

Employing an array of equilateral triangle micro-resonators with various sizes, a multi-wavelength semiconductor laser array can be formed, if the output waveguide is perpendicular to an incline making an angle of 45° with the wafer surface, then a surface emission multi-wavelength semiconductor laser array can be obtained. The output waveguides of the equilateral triangle micro-resonators having various sizes are collected to the same output waveguide, then a multi-wavelength semiconductor laser can be formed. When the output waveguide serving as an optical amplifier, the output power of the equilateral triangle micro resonator semiconductor lasers can be further enhanced.

SUMMARY OF THE INVENTION

An object of the invention is to provide an edge and surface emission semiconductor laser and array having the equilateral triangle micro optical resonators. The edge emission semiconductor laser and array have the output waveguide connected to the equilateral triangle resonators, and the surface emission semiconductor laser and array have an incline making an angle of 45° or 135° with the wafer surface and being perpendicular intersection with the output waveguide.

The main conception of this invention is to introduce a waveguide connected to one of the vertices of a triangle resonator, and further enables the output waveguide of the triangle resonator to be intersected with the aligned incline making an angle of 45° or 135° with the surface, to realize the edge and surface emission semiconductor laser and array of orienting output. By connecting the triangle resonators of various sizes to the same output waveguide, a semiconductor laser of multi-wavelength output is obtained. If the substrate is transparent to the emitting wavelength, e.g. InP substrate to 1.3 and 1.5 $\mu$m, surface emission laser light may be output from the growth surface or substrate; if the substrate is non-transparent to the emission wavelength, then a unthreaded hole should be etched on the substrate for the laser output from substrate side, or the incline of swallow-tailed mesa can be prepared by dry etching enabling the surface emission laser light to be output from the growth surface.

Mass production of the semiconductor laser and array having equilateral triangle resonator and orienting output may apply planar technology, and the surface emission semiconductor laser and array having equilateral triangle resonators can be fabricated using a conventional epitaxial wafer of the conventional edge emission semiconductor laser.

An object of the invention is realized by the following technical scheme:

The edge emission and surface emission semiconductor laser and array have equilateral triangle micro-resonators and output waveguides, which are an edge emission semiconductor laser having equilateral triangle resonator with output waveguide, and a surface emission semiconductor laser with equilateral triangle resonator having output waveguide and an incline deflecting output light by 90°. The structure comprises a slab waveguide composed of the lower cladding layer, active layer and upper cladding layer, the semiconductor material may be various active materials, e.g., InGaAsP, AlGaAs GaAs, InGaN, InGaAsN etc., and the corresponding materials of cladding layers. The active material may be bulk, quantum well, quantum wire, and quantum dot semiconductor materials. Employing quantum dot material can reduce the influence of nonradiative combination in etched surface. Wherein an external region of the equilateral triangle employs dry or wet etching technique to etch to the lower cladding layer or the substrate, while unetched equilateral triangle region serves as a resonator. The triangular sides are used as reflecting mirrors, and the vertices of the triangle or side are connected or coupled to the output waveguide for realizing directional emission. In case of the output waveguide be intersected with the cleavage plane or the orthogonal etched surface, and the cleavage plane coated with antireflecting film, then a conventional edge emission semiconductor laser having a triangular micro resonator can be produced; while the output light is deflected by 90° if the output waveguide is intersected with an incline, then a surface emission semiconductor laser having a triangle micro resonator can be made, likewise, its output end face should be coated with an antireflection film to reduce the influence of light feedback. The output waveguide may be an optical amplifier to enhance the output power. If the material is grown on (111) substrate, then the equilateral triangle resonator might be easily obtained by wet chemical etching.

The semiconductor laser array or multi-wavelength semiconductor laser array having equilateral triangle resonator may be formed by the lasers having the equilateral triangle resonators of the same or different sizes.

BRIEF DESCRIPTION OF THE DRAWINGS

Incorporated with the accompanied drawings and embodiments, structure and characteristics of the invention shall be further described as follows, in which.

Figure 3A:
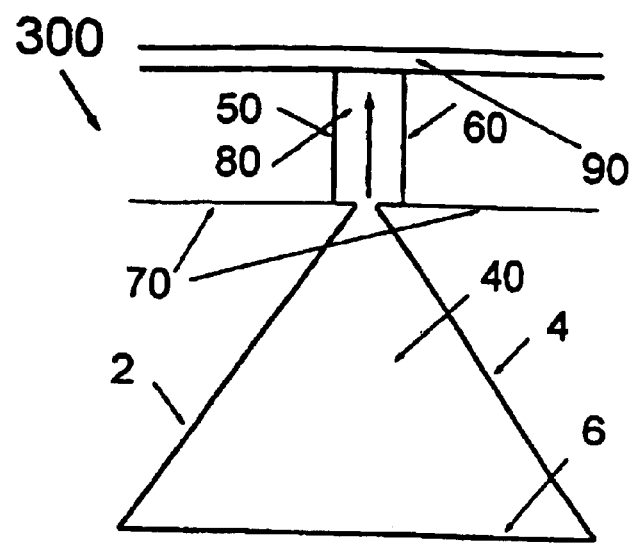
FIG. 3 is a schematic of a surface emission semiconductor laser with the equilateral triangle resonators having the output waveguide and an incline deflecting the output light by 90°.
Figure 3B:
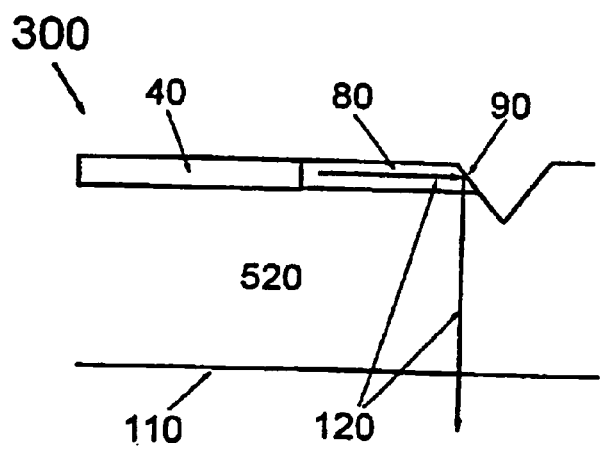
Figure 3C:
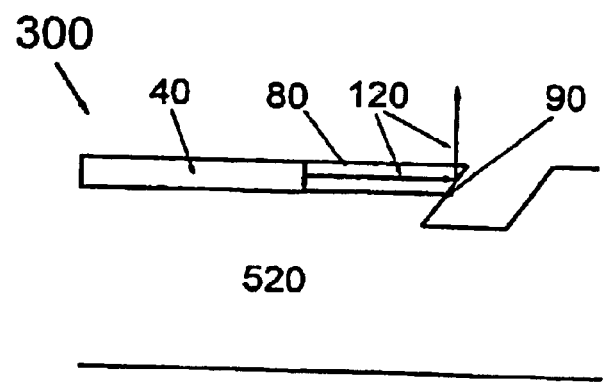

In which:

FIG. 3a is an inclined top view;

FIG. 3b is the schematic structure of surface emission semiconductor laser with the equilateral triangle resonators having emission of light output from the substrate, the incline making an angle of 45° with the surface can be etched by selective wet chemical corrosive etching or etched on an inclined wafer by dry etching;

FIG. 3c is the schematic structure of surface emission semiconductor laser with the equilateral triangle resonators having emission of light output from the surface, and the incline making an angle of 135° with the surface may be etched on the inclined wafer by dry etching process;

FIG. 4 is the schematic graph of the steps of fabricating the surface emission semiconductor laser having the equilateral triangle resonators according to the invention;

In which:

FIG. 4a is the schematic structure of step 1;
FIG. 4b is the schematic structure of step 2;
FIG. 4c is a top view of step 3;
FIG. 4d is a top view of step 4;
FIG. 4e is the schematic structure of step 5.

DETAILED DESCRIPTION OF THE EMBODIMENTS

Figure 1:
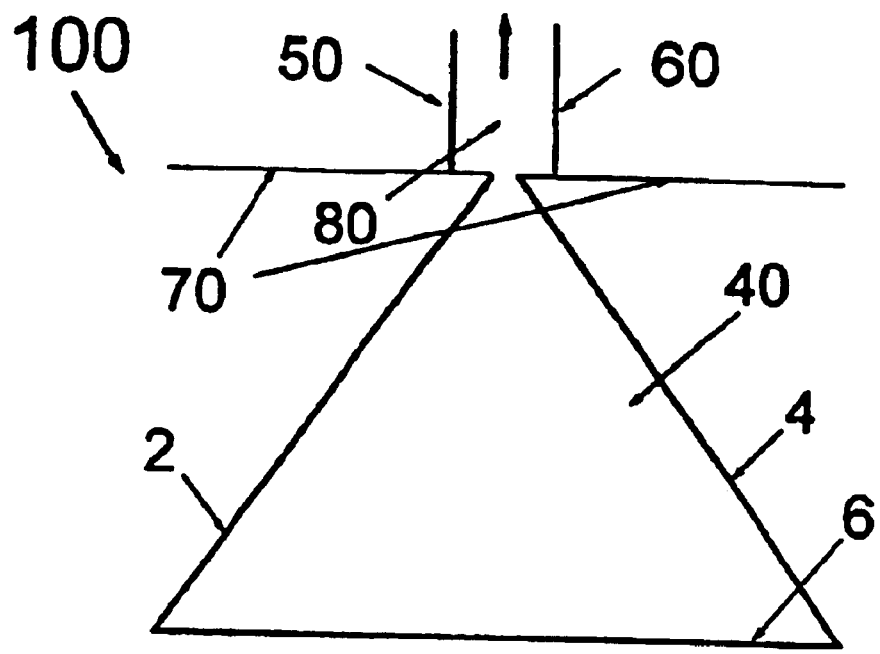
FIG. 1 is an inclined top view of a semiconductor laser with an equilateral triangle resonator having orienting output.

First refer to that shown in FIG. 1, which represents the first embodiment of the invention, which is an inclined top view of an equilateral-triangle-resonator laser 100 with an output waveguide 80. The wafer of the device is the same slab waveguide as conventional edge emission semiconductor lasers consisted of lower cladding layer, active layer and upper cladding layer. Etching through the lower cladding layer of the outside region of equilateral triangle 40 surrounded by the three sides 2, 4, 6 will form a triangle resonator. The side length of the triangle resonator ranges from several micrometers to thousand of micrometers. An output waveguide can be formed by connecting the equilateral triangle 40 to the output waveguide 80 with the width between sub-micrometer to tens of micrometers, which is composed of two side lines 50 and 60. The output waveguide 80 can be a weak waveguide for maintaining single mode condition, but a strong waveguide can limit the scatter of the output light beam between the resonator 40 and the output waveguide 80. The electrode can form in the resonator 40 and the output waveguide 80, and electric wire can connect via 90 for injecting current to the resonator. The output waveguide can serve as an optical amplifier to enhance the laser output.

Figure 2:
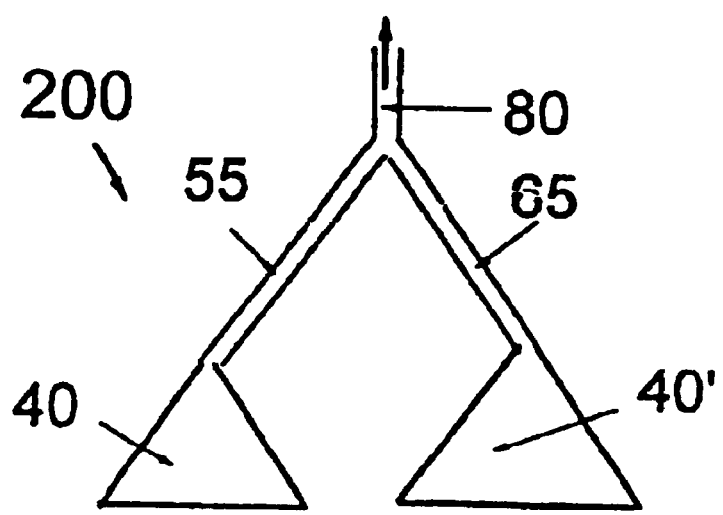
FIG. 2 is a top view of a plurality of equilateral triangle resonators connected to a same output waveguide, forming a multi-wavelength semiconductor laser, the output waveguide can be used as an optical amplifier.

FIG. 2 is a top view of a multi-wavelength semiconductor laser 200, output waveguides 55 and 65 of equilateral triangle resonators 40 and 40' are combined to output waveguide 80, every resonator is a single mode resonator, output wavelength may be regulated via changing the size of the triangle. The output waveguide can also serve as a semiconductor optical amplifier to enhance the output power. The triangle resonator is electric-insulating with the output waveguides 55 and 65, then independent modulation of every output wavelength can be realized. For simplicity, only two triangle resonators 40 and 40' are shown, and the combination of the output waveguides are schematic.

FIG. 3 is an inclined top view of surface emission semiconductor laser 300 with the equilateral triangle resonator, the laser has an output waveguide and an incline deflecting the output beam by 90°. The wafer of the device is the same slab waveguide as conventional edge emission semiconductor lasers consisted of lower cladding layer, active layer and upper cladding layer grown on the substrate. The external region of the equilateral triangle 40 surrounded by three sides 2, 4, 6 with the length from several micrometers to thousand micrometers is etched through the lower cladding layer to generate the difference of refractive index inside and outside the triangular region, therefore a triangle resonator is formed, and the output waveguide 80 formed by two sides 50, 60 with the width of sub-micrometer to tens of micrometers is connected to the triangular resonator 40. An incline 90 making an angle 45° or 135° with the surface intersects with the output waveguide and forms the surface emission output by deflecting the output by 90°. FIG. 3b is the schematic structure of the surface emission semiconductor laser 300 with the equilateral triangle resonator 40 having the output waveguide 80 and the incline 90 making an angle of 45° with the surface to deflect the output light beam 120 by 90°. After the deflection of 90°, the output light beam 120 emits from the substrate 520, an antireflection film 110 may be coated on the back face of substrate 520 to avoid the influence of light feedback to the equilateral triangle resonator. FIG. 3c is the schematic structure of surface emission semiconductor laser 300 with the equilateral triangle resonator 40 having the output waveguide 80 and the incline 90 making an angle of 135° with the surface enabling the output light beam 120 to deflect 90°, and output light beam 120 being output from the front surface after 90° deflection. At the emitting window of light, antireflection film should be coated to prevent the influence of light feedback. In FIGS. 3b and 3c, the electrodes can be fabricated on the top of unetched equilateral triangle and the substrate surface, and the deep etching region can replace the substrate surface to be used as the electrode region.

FIG. 4 shows the steps of fabricating the semiconductor laser with the triangular resonator as shown in FIG. 3; FIG. 4a shows step 1 (the schematic structure), i.e., a conventional edge emission laser wafer comprising lower cladding layer 18, active layer 16, upper cladding layer and ohmic contact layer 14 grown on substrate 520 employing the methods of molecular beam epitaxy or metalorganic chemical vapor deposition etc.; FIG. 4b shows step 2 (the schematic structure), electrode 12 is evaporated on the epitaxial layer; FIG. 4c shows step 3, the pattern of equilateral triangle resonator is formed by photolithography technique and the electrode outside the equilateral triangle resonator 40 and output waveguide 80 are etched. On the top view, the electrode only exists in regions 40 and 80, and the cover layer is the ohmic contact layer 14 in other regions. Then photolithography and shallow etching are applied to form the output waveguide 80. The two sides of the output waveguide 80 is the shallow etched region 150, and the other external region of the equilateral triangle resonator 40 is the unetched upper cladding and ohmic layer; FIG. 4d shows step 4 (top view), an etching resist layer is deposited and patterned with the etching resist layer outside the equilateral triangle resonator 40, region 150 and output waveguide 80 being removed. Then the wafer is etched by reaction ion beam etching technique, etc., to the substrate 520. After dry etching, the cover layer in the triangular resonator 40 and output waveguide 80 is the electrode layer 12, and the cover layer in region 150 is a shallow etched region, and the other regions are the substrate layer 520; FIG. 4e shows step 5 (the schematic structure), a photoresist is deposisted on the wafer and then patterned for etching the incline 90 which makes an angle of 45° with the surface and enables the output light beam 120 to be emitted from the back surface. The incline can be etched by placing the wafer in a certain angle in a dry etching chamber. Then the electrode on the substrate surface is deposited, and the electrode at the output window is removed and antireflection film is deposited to reduce the influence of light feedback (if the substrate is non-transparent, then the unthreaded hole is required to be etched on the substrate). The devices may be tested on the whole wafer scale, and cleaving of resonator surface is unnecessary.

What is claimed is:

1. A semiconductor laser with equilateral triangle micro optical resonators has an output waveguide, and the wafer structure comprises the slab waveguide composed of a lower cladding layer, an active layer, and an upper cladding layer, wherein: outer region of equilateral triangle resonator is etched to the lower cladding layer or substrate, while the unetched equilateral triangle region is used as a resonator, sides of the triangle serve as reflecting mirrors, and on the vertices or sides of the triangle an output waveguide being connected or coupled, and an incline is intersected with the output waveguides enabling the output light to be deflected by 90° in order to form surface emission output.

2. The semiconductor laser having the equilateral triangle micro optical resonators according to claim 1, wherein one of the vertices of equilateral triangle is connected to an output waveguide.

3. The surface emission semiconductor laser having the equilateral triangle micro optical resonators according to claim 1, wherein one of the vertices of the equilateral triangle is connected to the output waveguide, and an incline making an angle of 135° with the surface intersects with the output waveguide, enables the output light to deflect 90° and the surface emission laser output emitted from the front surface is formed.

4. The surface emission semiconductor laser having the equilateral triangle micro optical resonators according to claim 1, wherein one of the vertices of the equilateral triangle is connected to an output waveguide, and an incline making an angle of 45° with the surface intersects with the output waveguide enables the output light to deflect 90° and surface emission laser output emitted from the substrate is formed.

5. The semiconductor laser having the equilateral triangle micro optical resonators according to claim 1, wherein a plurality of equilateral triangle resonators of various sizes form a multi-wavelength semiconductor laser linear array or coupled to the same output waveguide to form a multi-wave semiconductor laser.

6. The surface emission semiconductor laser having the equilateral triangle micro optical resonators according to claim 1, wherein the surface emission semiconductor linear or planar array are formed by a plurality of surface emission equilateral triangle resonator lasers.

7. The multi-wavelength surface emission semiconductor laser array having the equilateral triangle micro optical resonators according to claim 1, wherein the multi-wavelength surface emission semiconductor laser linear or planar array are formed by a plurality of equilateral triangle resonator lasers of various sizes.

* * * * *